United States Patent
Mandal et al.

(10) Patent No.: US 12,235,318 B2
(45) Date of Patent: Feb. 25, 2025

(54) METHODS FOR DETERMINING AND CALIBRATING NON-LINEARITY IN A PHASE INTERPOLATOR AND RELATED DEVICES AND SYSTEMS

(71) Applicant: Samsung Electronics Co., Ltd., Suwon-si (KR)

(72) Inventors: Gunjan Mandal, Bengaluru (IN); Sunil Rajan, Bengaluru (IN); Raghavendra Molthati, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/219,484

(22) Filed: Jul. 7, 2023

(65) Prior Publication Data

US 2024/0044978 A1  Feb. 8, 2024

(30) Foreign Application Priority Data

Jul. 12, 2022  (IN) .............................. 202241039910

(51) Int. Cl.
| | | |
|---|---|---|
| *G01R 31/00* | (2006.01) | |
| *G01R 23/20* | (2006.01) | |
| *G01R 31/317* | (2006.01) | |

(52) U.S. Cl.
CPC ....... *G01R 31/31727* (2013.01); *G01R 23/20* (2013.01); *G01R 31/3171* (2013.01)

(58) Field of Classification Search
CPC ........ G01R 31/31709; G01R 31/31726; G01R 31/3171; G01R 23/20; G01R 31/31727; G01R 31/31716
See application file for complete search history.

(56) References Cited

U.S. PATENT DOCUMENTS 8,634,509 B2   1/2014  Crain et al.
8,953,668 B2 * 2/2015  Wu ........................ H03L 7/093
                                                    375/376

(Continued)

OTHER PUBLICATIONS

David M. Moore, "Circuits and Techniques for Cell-based Analog Design Automation in Advanced Processes", Phd thesis, 2018 (University of Michigan).

(Continued)

*Primary Examiner* — Esaw T Abraham
(74) *Attorney, Agent, or Firm* — Muir Patent Law, PLLC

(57) ABSTRACT

Methods and systems for determining and calibrating non-linearity in a phase interpolator. Embodiments determine a first jitter value that causes the bit error rate (BER) of a data sequence to exceed a predefined target BER, when a recovered clock is aligned with the data sequence at a first PI code. The recovered clock is obtained from a data pattern representing the data sequence. Embodiments determine a second jitter value that causes the BER of the data sequence to exceed the predefined target BER at a second PI code. The first PI code may immediately precede or succeed the second PI code. Embodiments determine a Differential Non-Linearity (DNL) corresponding to the second PI code, based on a phase shift introduced to the recovered clock by the second PI code relative to the first PI code, the first jitter value, and the second jitter value. All DNL values corresponding to all PI codes may be determined in a similar manner. An Integral Non-Linearity (INL) may be determined by integrating the DNL corresponding to all PI codes.

16 Claims, 8 Drawing Sheets

(56) References Cited

U.S. PATENT DOCUMENTS

| | | | |
|---|---|---|---|
| 9,036,764 B1* | 5/2015 | Hossain | H04L 7/0337 |
| | | | 375/376 |
| 9,077,349 B2* | 7/2015 | Kong | H03L 7/0805 |
| 9,209,962 B1 | 12/2015 | Mishra et al. | |
| 10,084,623 B1* | 9/2018 | Mactaggart | H04L 7/0079 |
| 10,419,203 B1 | 9/2019 | Novellini et al. | |
| 10,466,289 B2* | 11/2019 | Lee | G01R 31/31709 |
| 11,009,546 B2* | 5/2021 | Hojabri | G01R 31/31905 |
| 11,469,877 B1* | 10/2022 | Raj | H04L 25/4917 |
| 2013/0093433 A1 | 4/2013 | Lee et al. | |

OTHER PUBLICATIONS

Jakobsson, A. et. al., "A Low-Noise RC-Based Phase Interpolator in 16-nm CMOS," IEEE Transactions on Circuits and Systems II: Express Briefs, Jan. 2019, pp. 1-5, vol. 66, No. 1.

Rainer Kreienkamp et. al., "10-GB/s CMOS Clock and Data Recovery Circuit With an Analog Phase Interpolator," IEEE JSSC, vol. 40, No. 3,pp. 736?743, Mar. 2005.

S. Saxena et. al., "A 2.8mW/GB/s 14Gb/s serial link transceiver," IEEE JSSC, vol. 52, No. 5, pp. 1399-1411, May 2017.

\* cited by examiner

METHODS FOR DETERMINING AND CALIBRATING NON-LINEARITY IN A PHASE INTERPOLATOR AND RELATED DEVICES AND SYSTEMS

TECHNICAL FIELD

Embodiments herein relate to non-linearity in wire-line receivers, and more particularly to methods and systems for measuring non-linearity in a Phase Interpolator (PI) of a wire-line receiver and reducing/nullifying the measured non-linearity.

BACKGROUND

A wire-line receiver receives a data sequence in the form of a data pattern from a transmitter over a wired connection therebetween. The receiver recovers the clock from the received data pattern using a Clock and Data Recovery (CDR) circuit in the receiver. The receiver includes an Analog Front End (AFE), which comprise equalizers for boosting frequencies that had undergone losses while traversing the channel between the transmitter and the receiver, due to noise, jitter, inter-symbol interference, and so on. The receiver includes a sampler which, using a recovered clock, samples data pulses in the data pattern at the centre of the pulses. The CDR functions to have the sampler samples the data pattern, using the recovered clock, at the centre of the pulses. The recovered clock is configured to track the data pattern within the bandwidth of the CDR. If the data sequence is affected by jitter having a frequency beyond the bandwidth of the CDR the receiver may not be able to track the jitter. The output of the sampler comprises values (e.g., logic values) obtained by sampling the data pulses at the centre of the data pulses to obtain a recovered data sequence.

The receiver includes a Phase Detector (PD) for comparing the phase of the recovered clock with respect to the phase of the sampled data pattern to determine a phase difference between the same. The PD can send a Phase Interpolator (PI) of the receiver phase interpolator codes (PI codes) based on the determined phase difference. The PI can adjust the phase of the recovered clock in a granular manner, as the PI code is updated by the CDR based on information provided by the PD. The phase adjustment enables phase locking of the recovered clock to the received data pattern while ensuring that the sampler samples the data pattern at the centre of the data pulses forming the data pattern. The granularity of phase adjustment depends on the architecture of the receiver and can be configured based on the clock rate used by the receiver (the internal clock generated by a Phase Locked Loop (PLL) of the receiver) and the number of PI codes used by the PI to adjust the phase of the recovered clock.

The PI can have non-linearity, such as Differential Non-Linearity (DNL) and Integral Non-Linearity (INL). The non-linearity in the PI can affect the granularity of its phase adjustment such that the phase adjustment by the PI is non-uniform across the PI codes. For example, when the rate of the data pattern is defined as 1/UI (Unit Interval) and the PI operates based on 64 PI codes, the PI divides one UI into 64 segments and the ideal granularity of phase adjustment is UI/64. However, due to the non-linearity the actual granularity of phase adjustment is (UI/64±x), wherein 'x' is the DNL, which can vary based on the particular PI code. The INL can be obtained by integrating the DNL over all the PI codes.

The existing systems measure the non-linearity of the PI and minimize/nullify the non-linearity to increase the jitter tolerance of the receiver. In order to measure the non-linearity of the PI, the clocks at the input and output terminals of the PI are obtained. A PLL clock (obtained from the PLL) corresponds to the clock at the input terminal of the PI and the recovered clock corresponds to the clock at the output terminal of the PI. The non-linearity in the PI is determined by measuring the phase difference between the PLL clock and the recovered clock for each of the PI codes.

For measuring the non-linearity, the retrieval of the PLL clock and the recovered clock from the receiver requires additional pins (i.e., chip terminals of the wire-line receiver is embodied as a semiconductor chip), such as two pins to output the PLL clock and two pins to output the recovered clock (where the clocks are provided as a differential signal). The requirement of having four additional pins costs the chip area. In addition, the off-chip measurement of the phase difference between the PLL clock and the recovered clock requires a measuring instrument (such as an oscilloscope), which can involve additional hardware costs, thus increasing bill of materials (BOM).

In addition, because the PLL clock and the recovered clock typically have a high clock rate, the accuracy of the retrieved PLL clock and the retrieved recovered clock can be impacted due to introduction of parasitic capacitances (e.g., undesired capacitances within a semiconductor chip in which the receiver is formed). The accuracy may be further impacted by mismatch in transmission lines (at least four) used for retrieving the PLL clock and the recovered clock. Further, the retrieval of the PLL clock and the recovered clock requires inclusion of transmitters for balancing off-chip load contributed by the parasitic capacitances and the transmission lines. The output of the PLL clock and the recovered clock from a chip requires providing two transmitters in the chip. The transmitters can increase the complexity and occupy additional space in the chip area. The scalability of the receiver chip is thus limited by the transmitters as the transmitters are designed to operate at a particular frequency (data rate and clock rate).

OBJECTS

The principal object of the embodiments herein is to disclose methods and systems for determining non-linearity in a phase interpolator of a wire-line receiver and utilizing the determined non-linearity for calibrating the phase interpolator.

Another object of the embodiments herein is to utilize a pattern generator (which may be either on-chip or off-chip) for measurement of the non-linearity, wherein the pattern generator generates a data sequence as a data pattern for clock recovery, and aligning a recovered clock with the data pattern at multiple Phase Interpolator (PI) codes for determining non-linearity corresponding to all PI codes.

Another object of the embodiments herein is to determine non-linearity corresponding to each PI code based on values of jitter, which, on application, causes the Bit Error Rate (BER) to increase to a target BER at a first PI code and at an adjacent PI code immediately preceding and succeeding the first PI code and also based on a phase difference introduced to the recovered clock by the adjacent PI code relative to the first PI code.

SUMMARY

Accordingly, the embodiments provide methods and systems for measuring non-linearity in a Phase Interpolator (PI)

of a wire-line receiver. The embodiments include determining a first jitter value that causes a Bit Error Rate (BER) of a data sequence to exceed a predefined target BER, when a recovered clock is aligned with the data sequence at a first PI code. The receiver includes a Clock and Data Recovery (CDR) unit, which may initially lock the recovered clock with the data sequence at a PI code. Subsequently, the CDR is not involved in the alignment of the clock and the data sequence at other PI codes. In an embodiment, the data sequence can be a clock pattern generated by a pattern generator in the wire-line receiver, wherein the recovered clock is obtained from the data sequence. The embodiments include determining a second jitter value that causes the BER of the data sequence to exceed the predefined target BER at a second PI code, wherein the first PI code either immediately precedes or immediately succeeds the second PI code. The embodiments include determining a Differential Non-Linearity (DNL) corresponding to the second PI code, based on a phase shift introduced to the recovered clock by the second PI code relative to the first PI code, the first jitter value, and the second jitter value.

The first and second PI codes can be within a portion of the Unit Interval (UI) of the data sequence. The UI can be split into a plurality of portions, wherein each portion can correspond to a different subset of a plurality of PI codes. The embodiments include measuring DNL corresponding to each of the plurality of PI codes in each of the plurality of portions. The Integral Non-Linearity (INL) of the PI may be determined by integrating the DNL corresponding to each of the plurality of PI codes in each of the plurality of portions. The phase interpolator may be calibrated based on the DNL corresponding to each of the plurality of PI codes in each of the plurality of portions and the INL.

These and other aspects of the embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

Embodiments herein are illustrated in the accompanying drawings, throughout which like reference characters indicate like parts in the various figures. The embodiments herein will be better understood from the following description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Details of well-known components and processing techniques may be omitted so as to not unnecessarily obscure the embodiments herein. It should be appreciated that the examples described herein should not be construed as limiting the scope of the invention.

Figure 1:
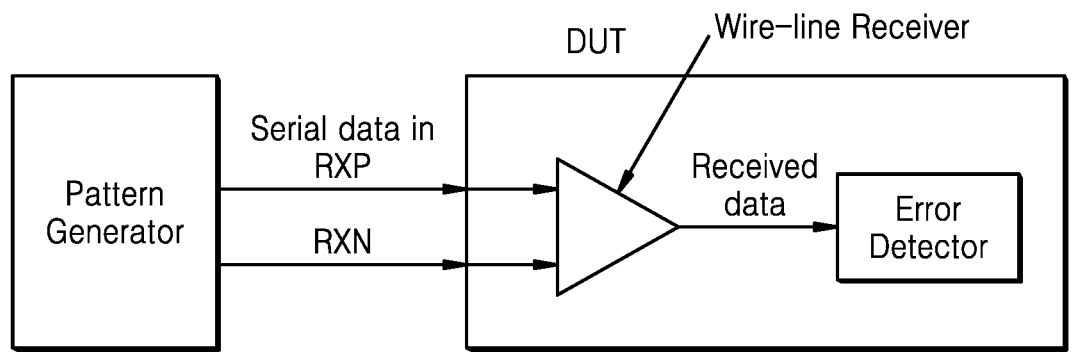
FIG. 1 depicts a measurement setup for measuring non-linearity in a phase interpolator of a wire-line receiver.
Figure 5:
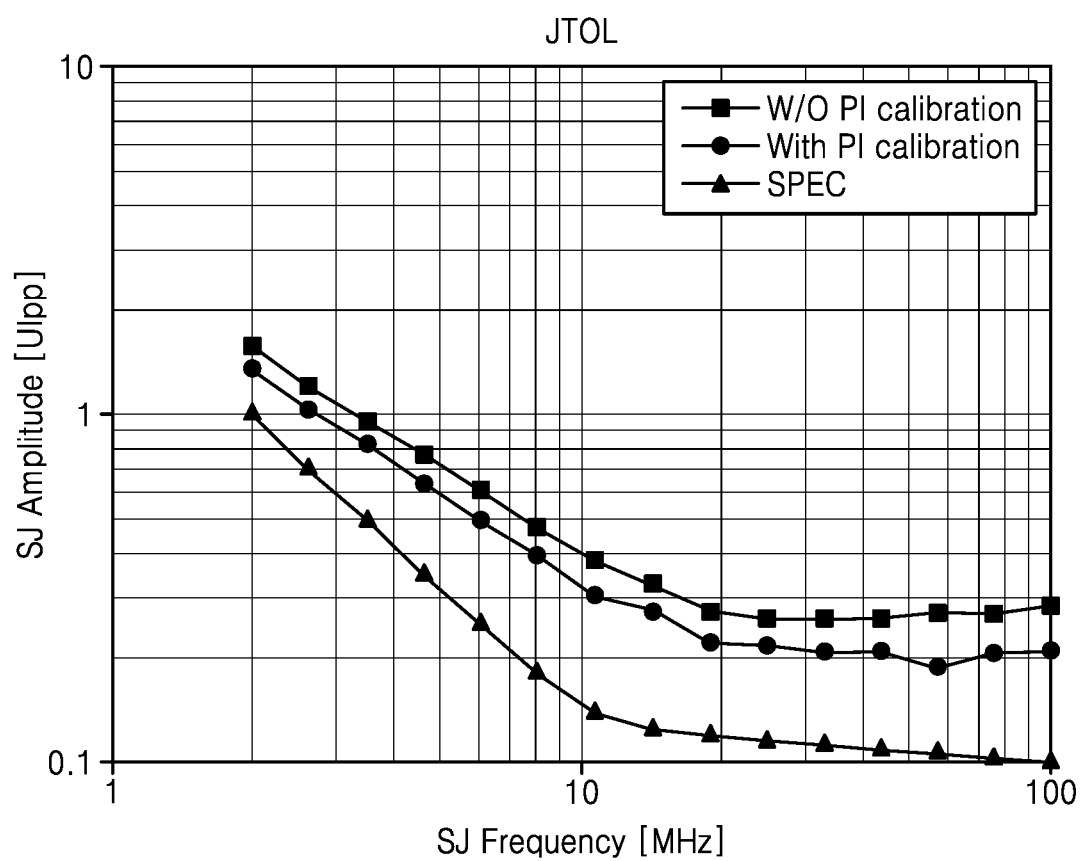
FIG. 5 depicts a comparison between jitter tolerance curves of the wire-line receiver before and after calibrating PI non-linearity, according to embodiments as disclosed herein.

Embodiments herein disclose methods and systems for measuring non-linearity in a phase interpolator of a wire-line receiver and utilizing the measured non-linearity for calibrating the phase interpolator. To assist in understanding various details of the embodiments, the description herein may use the following phrases to assist in understanding certain distinctions: a "data sequence" as used herein refers to data values (e.g., logical values of 0's and 1's forming bits of a larger data packet, word, byte, etc.); a data sequence may be stored in memory (sometimes referred to as a "stored data sequence" in this instance) and may be also be transmitted as a "data pattern"; a "data pattern" refers to the pattern of a signal (e.g., a waveform of a signal, such as a series of pulses) that represents a data sequence; the extraction of data from a received data pattern may be referred to as a "recovered data sequence" (the "recovered data sequence" may or may not be the same as the transmitted data sequence represented by the transmitted data pattern as errors may occur in the corresponding transmission and/or extraction). Referring now to the drawings, and more particularly to FIGS. 1 and 5, where similar reference characters denote similar structure and/or features consistently throughout the figures, there are shown preferred embodiments.

FIG. 1 depicts a measurement setup for measuring non-linearity in a phase interpolator of a wire-line receiver. The embodiments utilize a pattern generator for generating a data pattern, wherein data pulses of the data pattern are fed serially to the wire-line receiver (Device under Test (DUT)). The wire-line receiver may be a circuit that is part of an integrated circuit of a semiconductor chip (the DUT in this embodiment). It will be appreciated that the structure of the elements forming the wire-line receiver are also circuits that are interconnected to form the larger integrated circuit. Other circuits (which may not be described herein) may also be formed as part of the integrated circuit depending on the type and design of the integrated circuit/semiconductor chip (such as, e.g., memory of a memory chip, a processing core of a CPU or GPU, a CODEC, an SoC, such as that forming a modem, etc.). The pattern generator can be on-chip (part of the DUT) or off-chip (outside the DUT). The pattern generator is used for testing BER performance and Jitter Tolerance (JTOL performance) of the wire-line receiver and checking the compliance requirements in terms of BER and JTOL performance. The BER performance is determined using an error detector. The error detector can be on-chip (part of the DUT) or off-chip (outside the DUT).

The serial data pattern is typically provided serially as a differential signal to the terminals RXP and RXN of the wire-line receiver. The RXP terminal may be the non-inverting input terminal of the wire-line receiver and the RXN may be the inverting input terminal of the wire-line receiver and may respectively correspond to the non-inverting input terminal and the inverting input terminal of an high speed amplifier forming the wire-line receiver that converts the differential signal to a single ended signal. The wire-line receiver can recover the data sequence from the received data pattern using a clock, which may be a recovered clock. The data sequence may also be separately provided by the pattern generator and can be stored in the wire-line receiver or other portion of the DUT (e.g., previously provided to the DUT at a lower data rate and stored in a register of the DUT that is accessible by the error detector). The error detector obtains the recovered data sequence from the wire-line receiver and the stored data sequence. The recovered data sequence is that obtained by sampling the received data pattern using the recovered clock. The error detector can compare the recovered data sequence with the stored data sequence to determine bit errors in the recovered data sequence and thus a BER performance of the wire-line receiver. In other examples, the error detector may be an error correction circuit (ECC) which may detect bit errors of the recovered data sequence using conventional ECC techniques using an error correction code. The error correction code may be a part of the data sequence received by the wire-line receiver (DUT).

The embodiments include applying an increasing amount of jitter to the data pattern generated by the pattern generator that is provided to the wire-line receiver and corresponds to the data sequence that is stored in the wire-line receiver. The embodiments include ensuring that the BER is zero (the recovered data sequence is exactly matching with the stored data sequence) or at or below a predetermined number (i.e., so that the bit errors are correctable by ECC). The embodiments include determining the maximum amount of jitter that can be applied to the data pattern, at the pattern generator, in the presence of which the wire-line receiver can recover the data sequence with the BER equal to a predefined target BER. The embodiments include determining the BER performance of the wire-line receiver based on the capability of the wire-line receiver to recover the data sequence from the data pattern received from the pattern generator in the presence of jitter. The embodiments include determining the DNL at each phase interpolator code based on a jitter that can be applied at that PI code to ensure that the BER is equal to the predefined target BER and a jitter that can be applied at a preceding PI code or a successive PI code to ensure that the BER is equal to the predefined target BER.

Figure 2:
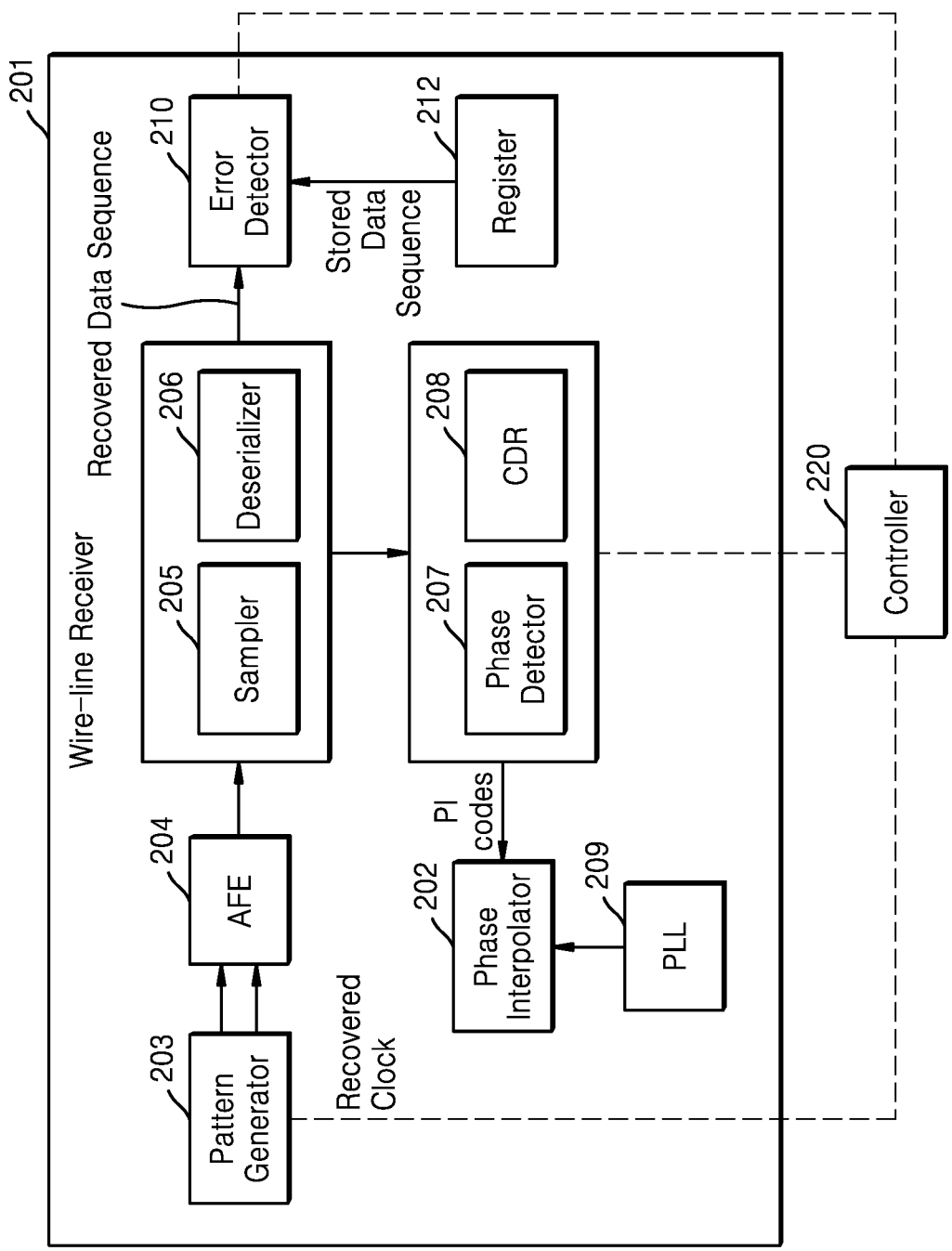
FIG. 2 depicts a wire-line receiver configured to measure non-linearity in a phase interpolator of the wire-line receiver and calibrate the measured non-linearity, according to embodiments as disclosed herein.

FIG. 2 depicts a wire-line receiver 201, wherein the wire-line receiver 201 is configured to measure and calibrate non-linearity in a phase interpolator 202 of the wire-line receiver 201, according to embodiments as disclosed herein. As depicted in FIG. 2, the wire-line receiver 201 includes the phase interpolator 202, a pattern generator 203, an Analog Front End (AFE) 204, a sampler 205, a deserializer 206, a phase detector 207, a Clock and Data Recovery (CDR) 208, a Phase Locked Loop (PLL) 209, an error detector 210, register 212 and a controller 220. The Analog Front End (AFE) 204, sampler 205, deserializer 206, phase detector 207, Clock and Data Recovery (CDR) 208 and Phase Locked Loop (PLL) 209 may be conventional circuits of a receiver. For example, the AFE 204 may be an operational amplifier (op amp) that receives the data sequence as a differential signal provided to the wire-line receiver on terminals RXP and RXN, the op amp having its non-inverting input terminal and inverting input terminal directly connected to terminals RXP and RXN, respectively, of the wire-line receiver. The AFE 204 may output a single-ended signal corresponding to the differential signal on RXP and RXN. The sampler 205 may be a latch that latches the single ended signal (i.e., the logic value of '1' or '0' (i.e., bit) represented by the single ended signal) at a timing determined by the phase interpolator 202. Specifically, the phase interpolator may output a clock signal having a clock edge (a transition between a high and low value of the voltage waveform of the clock) or clock pulse that triggers the sampler 205 to latch the value of the single ended signal output by AFE (e.g., op amp) 204. The deserializer 206 may receive the recovered data sequence as a series of logic values (i.e., a series of bits) and may convert the same to parallel form to provide the recovered data sequence as one or more bytes, words, etc. In an example, the AFE 204 may be an high speed amplifier that receives the data sequence as a differential signal provided to the wireline receiver on terminal RXP and RXN. The AFE 204 amplifies the high frequency signals and attenuates the low frequency signals. The differential output of the AFE 204 is given to the sampler 205. The sampler 205 may be a latch that latches the differential input signal at a time determined by the phase interpolator 202 output clock.

In an embodiment, the pattern generator 203 provides a data sequence in the form of a data pattern which is used for measuring the non-linearity of the phase interpolator 202. The data pattern generated by pattern generator 203 can be a/clock pattern that allows clock recovery by the CDR 208 (e.g., providing a data pattern having a series of pulses at regularly spaced Unit Intervals and may also include the data pattern having predetermined sub-patterns provided at regular intervals within the larger data pattern). When transmitted by the pattern generator 203, the data sequence may be a sequence of logical values of 1's and 0's (i.e., bits) may be represented by the data pattern in the form of a differential signal. For example, each bit of the data sequence may be represented by a pulse of the differential signal in a corresponding Unit Interval of the data pattern, where a positive voltage of RXP with respect to RXN represents a logical value of 1 and a negative voltage (or zero voltage) of RXP with respect to RXN represents a logical value of 0. The portion of the clock pattern within a particular Unit Interval may be referred to herein as a pulse. It should be appreciated that adjacent pulses in the data pattern may represent the same logic value and thus need not provide a transition in voltage level of the differential signal with respect to each other (i.e., the differential signal may remain unaltered over several sequential Unit Intervals to provide several sequential pulses representing the same logic value). The data sequence may be a predetermined data sequence that is obtained by the wire-line receiver in a separate communication and separately stored in the wire-line receiver 201 (and may be referred to herein as a "stored data sequence") in register 212. For example, the data sequence may be previously (or later) provided to the wire-line receiver by the pattern generator with at a relatively lower data rate (e.g., a second data pattern having relatively longer Unit Intervals to those of the data pattern being used to measure and calibrate non-linearity of the PI as described herein) to assure the data sequence is obtained (recovered) free of any bit errors and stored by the wire-line receiver. The recovered data sequence that is obtained/extracted using the recovered clock, can be compared with the stored data sequence is stored in the wire-line receiver 201 to measure the BER. The PLL 209 generates a clock signal which is provided as an input to the phase interpolator 202. The phase interpolator 202 provides a recovered clock as an output to the sampler 205.

The recovered clock may have the same frequency and pattern as the PLL clock output by the PLL 209 but may have a phase offset with respect to the PLL clock determined by the PI code received from the phase detector 207. The phase of the recovered clock output by the phase interpolator 202 (and thus the phase offset with respect to the PLL clock) may be adjusted by the phase detector 207 by changing the PI code provided to the phase interpolator 202.

Figure 3A:
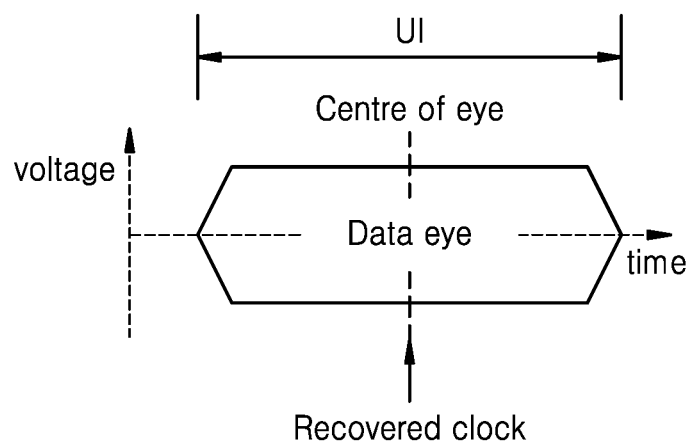
FIG. 3A depicts an example alignment of a recovered clock at the center of a pulse of a data sequence, according to embodiments as disclosed herein.

Initially, the CDR 208 can lock the recovered clock at the center of a Unit Interval (eye) of the data pattern generated by the pattern generator 203 (as received by the wire-line receiver 201). The CDR 208 is a digital filter which filters the output of the phase detector (207). The filtered output is the phase interpolator code. Locking the recovered clock at the center of a Unit Interval of the data pattern may include adjusting the phase of the recovered clock relative to the PLL clock such that the edge (or other latch triggering portion of the recovered clock) occurs at the center of each Unit Interval and thus the latch of the sampler 205 latches the logical value (i.e., latches the bit of the data sequence) represented by pulse at a time corresponding to the center of the corresponding Unit Interval. Note that this latching by the sampler 205 may be in the form of latching a single ended signal provided by the AFE 204 that corresponds to the received differential signal. FIG. 3A depicts an example alignment of the recovered clock at the center of a pulse of the data pattern. Consider there is no frequency dependent loss (such as Inter-Symbol Interference (ISI)), and no frequency offset. At this stage, jitter is not applied to the data pattern. Furthermore, at this stage, there is no delay applied to the data pattern by the pattern generator 203. The embodiments include determining the PI code, at which the locking (between the center of the pulse (data eye) of the data pattern and the recovered clock) has been achieved in such circumstances of no jitter or delay being applied to the data pattern. This determined PI code may be referred to herein as the first PI code.

Once the locking has been achieved, the CDR loop (loop between the sampler 205, the deserializer 206, the phase detector 207, the CDR 208 and the phase interpolator 202) can be opened. Opening of the CDR loop may refer to disabling the CDR 208 and/or failing to provide PI codes to the PI based on further analysis of the data pattern by CDR 208. Controller 220 may control the CDR to open the CDR loop. The process of measurement of the non-linearity of the phase interpolator 202 involves opening the CDR loop. The opening of the CDR loop may not initially effect the timing between the center of a pulse (eye or Unit Interval) of the data pattern and the recovered clock, achieved through the CDR 208. At least initially, the recovered clock continues to be aligned to the data pattern. The CDR loop is opened means: CDR output has a multiplexer 222 which can give the PI code generated from the phase detector 207 or the wire-line receiver 201 can force this PI code to any value using external register control. So for CDR loop open condition, the phase interpolator 202 input code PI code coming from the CDR is not given Instead the external register control is selected. The controller 220 can control the PI code input to the phase interpolator 202.

Figure 3B:
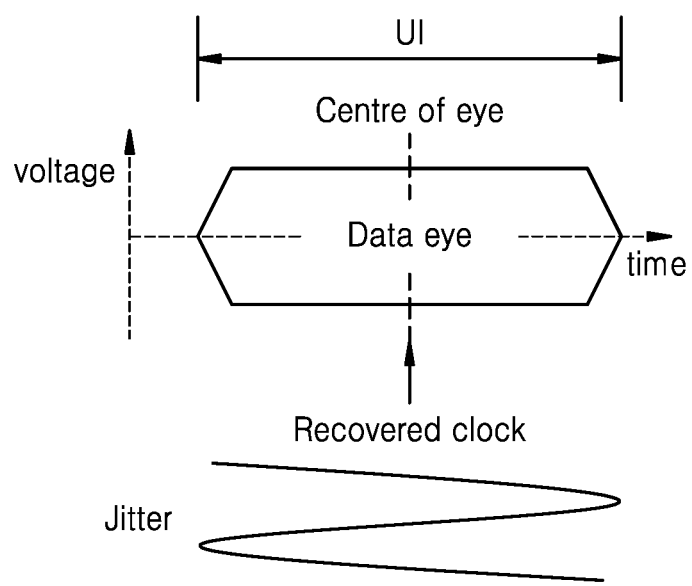
FIG. 3B depicts an example application of sinusoidal jitter on the pulse of the data sequence after opening of a CDR loop in the wire-line receiver, according to embodiments as disclosed herein.
Figure 3C:
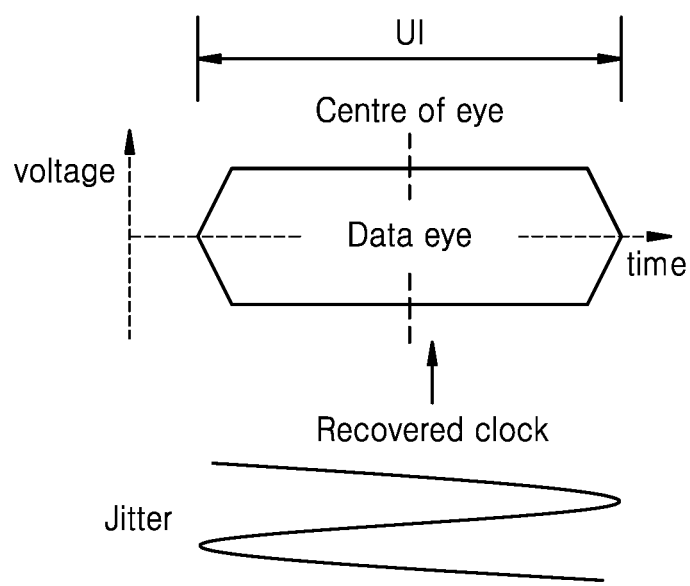
FIG. 3C depicts an example application of the sinusoidal jitter on the pulse of the data sequence after incrementing PI code, according to embodiments as disclosed herein.

The embodiments include controller 220 which may cause incrementally varying the PI codes, applying jitter on the data pattern, and determining jitter tolerance of the wire-line receiver 201 at each PI code based on BER performance. The initial alignment of the recovered clock and the data pattern (achieved through CDR locking) is lost due to the variation of the PI code (as represented in FIG. 3C).

Once the CDR loop is opened, jitter can be applied to the data pattern. Jitter may be applied to the data pattern by pattern generator 203. In an embodiment, the jitter can be sinusoidal jitter with a frequency of 100 MHz. FIG. 3B depicts an example application of sinusoidal jitter on the pulse of the data sequence after the opening of the CDR loop. The jitter can be applied with gradually increasing value until the eye is closed. The jitter will cause the recovered clock to sample outside the UI of the pulse of the data sequence. In an example, the amplitude of the jitter causing the closure of the eye can be about 0.5 UI (peak jitter amplitude, if peak-to-peak jitter amplitude is UI). The jitter means the timing variation of the clock or data edges from its ideal position. The DATA is the input coming from the pattern generator 203. The DATA edge can be varied in the pattern generator 203 by adding sinusoidal jitter on the data.

The application of the jitter causes a data sequence, recovered by the wire-line receiver 201 (referred to herein as a recovered data sequence), to differ from the data sequence transmitted by the pattern generator 203 (due to the errors that are introduced in the recovered data sequence by the applied jitter).

The error detector 210 can detect the error(s) by comparing the stored data sequence in register 212 with the recovered data sequence provided by deserializer 206. The wire-line receiver 201 and/or controller 220 determines whether the BER is equal to a predefined target BER. The target BER can be set to the predefined value based on compliance requirements (e.g., based on a specification setting forth minimum operation requirements for the wire-line receiver 200). The value of the applied jitter may be increased until the BER in the recovered data sequence equals the target BER. If it is determined that the BER is equal to or greater than the predefined target BER, then the applied jitter causing this BER can be considered as a first jitter (S−1). Reference herein to jitter at or associated with a PI code will be understood to be the jitter value that causes the BER to equal the predefined target BER when that PI code is applied (i.e., provided to phase interpolator 202 to cause phase interpolator 202 to provide a corresponding phase delay (or phase shift) in the PLL clock 209 in generating the recovered clock).

Thereafter, the embodiments include incrementing the PI code from the first PI code to a second PI code. Incrementing the PI code causes a phase shift to be introduced in the recovered clock, such as shown in FIG. 3C. The second PI code can be adjacent the first PI code (on either side) in the phasor space (to cause the smallest step in phase adjustment with respect to the first PI code in a particular phase adjustment direction). For example, if the first PI code is 10. The second PI code can be 9 or 11. Thereafter jitter can be applied on the data pattern. FIG. 3C depicts an example application of the sinusoidal jitter on the pulse of the data pattern (after the opening of the CDR loop) after incrementing the PI code from the first PI code to the second PI code. As depicted in FIG. 3C, a phase shift is introduced to the recovered clock due to the change in PI code. The recovered clock is no longer aligned to the center of the pulse of the data pattern.

The embodiments include determining the value of the jitter, which, on application on the data pattern (generated by the pattern generator 203), causes the BER to increase to the predefined target BER. The value of the jitter can be considered as a second jitter (S–2). The absolute value of the second jitter, applied at the second PI code, may be different from the absolute value of the first jitter.

The wire-line receiver 201 can determine a Differential Non-Linearity (DNL) associated with the second PI code based on the first jitter, the second jitter, and a phase shift introduced to the recovered clock by the second PI code, relative to the first PI code. In an embodiment, relation between the first jitter, the second jitter, and the phase shift, and the DNL associated with the second PI code can be represented as follows:

$$Abs(S-1-S-2)=PI\ step+DNL$$

The PI step is the phase shift introduced to the recovered clock at a PI code relative to a previous PI code. In an example if there are 64 PI codes, the PI step is assumed to be UI/64 by architecture. In an example, the integration is with respect to the PI code. The limits of integration depend on PI code range. For the phase interpolator with PI step of UI/64, integration limits are from 0 to 63.

After the determination of the DNL corresponding to the second PI code, the embodiments include incrementing the PI code from the second PI code to a third PI code. The second jitter, applied at the second PI code, which had caused the BER to increase to the predefined target BER, is treated the same as the first jitter, i.e., with respect to determining the DNL corresponding to the third PI code. Thereafter, jitter can be applied on the data pattern. The embodiments include determining the value of the jitter, which, on application on the data pattern, causes the BER to increase to the predefined target BER. The value of this jitter can be treated the same as a second jitter (S–2) with respect to determining the DNL corresponding to the third PI code.

The wire-line receiver 201 can determine the DNL associated with the third PI code based on the jitter associated with the second PI-code, the jitter associated with the third PI code, and a phase shift introduced to the recovered clock by the third PI code, relative to the second PI code. Differential Non-Linearity (DNL) associated with each PI code may be determined. Specifically, the DNLi associated with the i th PI code (where i is an integer between 1 and n, where n is the total number of PI codes) may be determined from the following equation:

$$Abs(Si-1-Si)=PI\ step+DNLi$$

where Si is the value of the ith jitter at the ith PI code, Si–1 is the value of the (i–1)th jitter at the (i–1)th PI code (for PI codes 2 to n, and is the value of the nth jitter for PI code 1), and PI step is the phase shift introduced to the recovered clock by the ith PI code (relative to the previous PI code (e.g., the (i–1)th PI code)). It should be appreciated that the PI step may be the same for all the PI codes (i.e., the incremental phase shift of the recovered clock caused by a unit increment of the PI code may be the same for all PI code unit increments). In addition, it should be appreciated that the DNL of a PI code may be determined by decrementing the PI codes and comparing the relative jitters of the current PI code and the previous PI code (e.g., determining DNLi from the equation Abs(Si-Si–1)=PI step+DNLi.

The wire-line receiver 201 can similarly determine the DNL associated with all individual PI codes. However, as the PI code is incremented, the jitter tolerance of the wire-line receiver 201 reduces. In general, the jitter of each PI code (the jitter at which the BER increases to the predefined target BER) becomes lower for each PI code as the PI code is incremented because the recovered clock position moves from the center of the pulses (UI) of the data pattern and crosses to the edge of the pulses (center of the UI). Therefore, the wire-line receiver 201 determines the DNL associated with only a predefined number of PI codes within the UI of the pulse of the data sequence. In an embodiment, the wire-line receiver 201 determines the DNL associated only with a subset of the PI codes before implementing a delay to the data pattern output by the data pattern generator 203. For example, if the total number n of PI codes is 64, the DNL may be determine for only 8 PI codes. This subset of PI codes may correspond to the clock edge of the recovered clock being positioned at a corresponding fraction of the UI (e.g., across UI/8 of a pulse of the data pattern) that is centered on the center of the pulse of the data pattern (i.e., the center of the data eye). This may be described herein as PI codes within a fraction of a UI, such as PI codes within ±UI/16 of the center of the pulse (or center of the data eye). It will be appreciated that the PI codes within ±UI/16 of the center of the pulse (or center of the data eye) correspond to PI codes within a span of UI/8 across the pulse.

Once the DNL associated with all the PI codes within ±UI/16 have been determined, the pattern generator 203 can apply a delay (phase shift) of ±UI/8 to the data sequence to determine DNL associated with another set of PI codes. Since the CDR loop has been opened, the CDR 208 will not align the recovered clock with the new delayed data pattern, generated by the pattern generator 203. After the application of the delay at the pattern generator 203, the receiver is configured by closing the CDR loop, so that the delayed data pattern is aligned with the recovered clock again (recall that the recovered clock was aligned to the data sequence at the first PI code prior to the opening of the CDR loop).

It should be appreciated that the order of determining the DNL associated with the PI codes may be varied and need not be sequential. For example, jitter at each of a subset of PI codes (e.g., associated with a fraction of the UI, such as UI/8) may first be determined in any order of the PI codes, and the corresponding jitter values of adjacent PI codes may then be used to determine DNL associated with PI code. In an embodiment, if the DNL associated with PI codes within +UI/16 (relative to the center of the pulse(s) of the data pattern) has been determined, the wire-line receiver 201 may then determine the DNL associated with PI codes within –UI/16 (relative to the center of the pulse(s) of the data pattern). Alternatively, if the DNL associated with PI codes within –UI/16 (relative to the center of the pulse(s) of the data pattern) is first determined, the wire-line receiver 201 can determine the DNL associated with PI codes within –+UI/16 (relative to the center of the pulse of the data pattern). The determination of the DNL of each additional set of PI codes occurs after the application of another delay of ±UI/8 to the data pattern by the pattern generator 203. For example, the pattern generator 203 may generate the data pattern at different delays of (0–1)×UI/k where k is an integer (e.g., 8 in this example), and j is an integer between 1 and k, such that k sets of PI codes are evaluated for their associated DNL, each jth set of PI codes being evaluated at a corresponding delay of j×UI/k and causing the clock edge of the recovered clock to shift UI/k across the pulse (±U1/(2k) with respect to the center of the pulse).

The wire-line receiver 201 can, thus, determine the DNL associated with all the PI codes. The wire-line receiver 201 can determine an Integrated Non-linearity (INL) by integrating the DNL associated with all the PI codes. The wire-line receiver 201 can calibrate the non-linearity in the phase interpolator 202 using the DNL values and the INL value.

According to some examples, the pattern generator 203 and the controller 220 are inside the wire-line receiver 202. The Sampler samples the data coming from the AFE 204 using the recovered clock and generates the data and edge signals. The phase detector 207 inside the CDR 208 detects the phase error sign using these data and edge signals and generates the phase interpolator code. The phase interpolator 202 adjusts the phase of the clock which samples the data. The CDR output has a multiplexer which can give the PI code generated from the Phase Detector 207 or the wire-line receiver 201 can force this PI code to any value using external register control. So for CDR Loop open condition, the Phase Interpolator 202 input code PI code coming from the CDR 208 is not given Instead the external register control is selected. The multiplexer can control which PI code is input to the phase interpolator 202.

FIG. 2 shows and examplary wire-line receiver 201, but it is to be understood that other embodiments are not limited thereto. In other embodiments, the wire-line receiver 201 may include less or more number of units. Further, the labels or names of the units of the wire-line receiver 201 are used only for illustrative purpose and will be understood to not limit the scope of the invention. One or more units can be combined together to perform same or substantially similar function in the wire-line receiver 201.

Figure 4A:
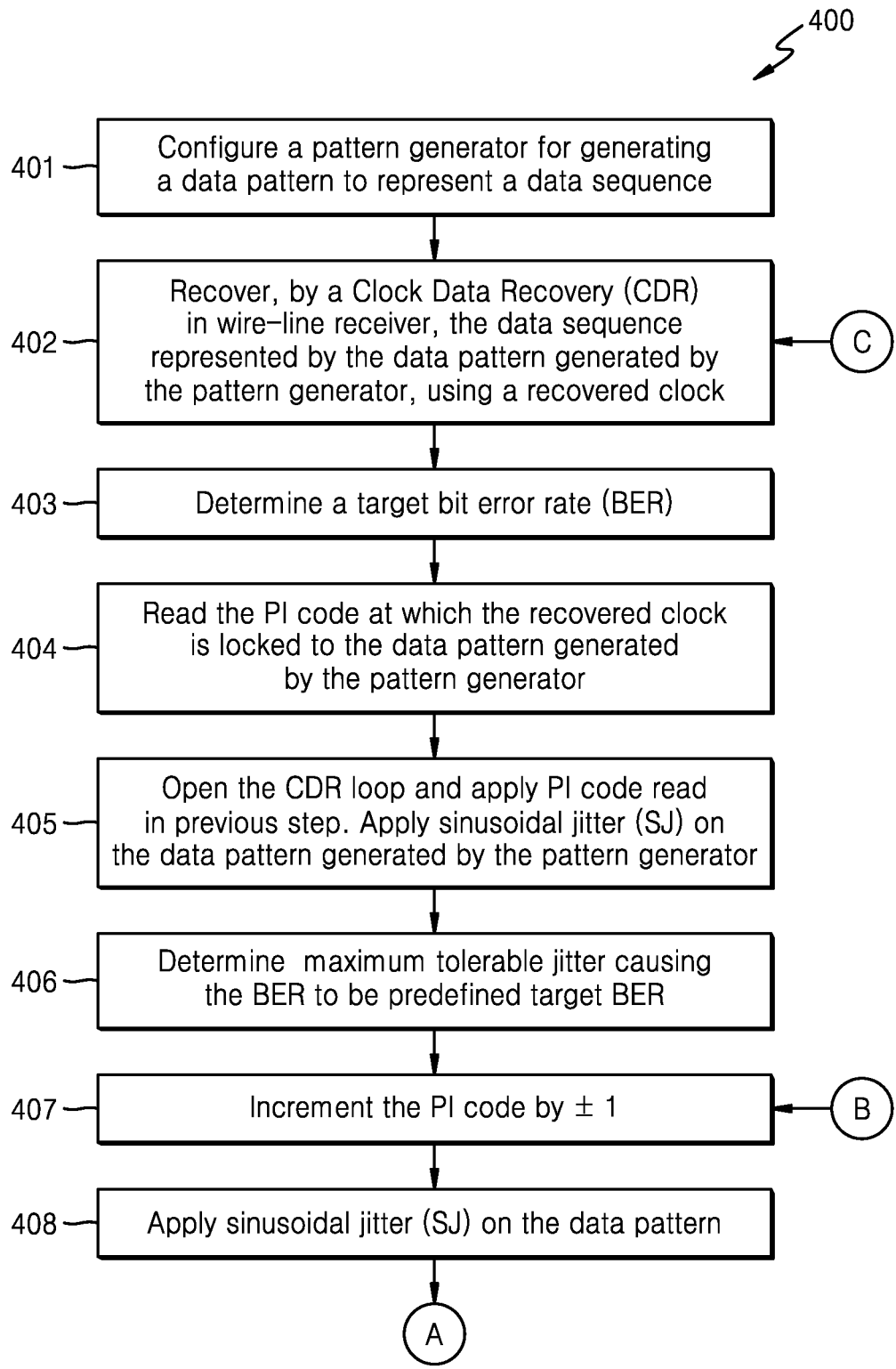
FIGS. 4A and 4B depict a flowchart depicting a method for measuring and calibrating the non-linearity in the phase interpolator of the wire-line receiver, according to embodiments as disclosed herein.
Figure 4B:
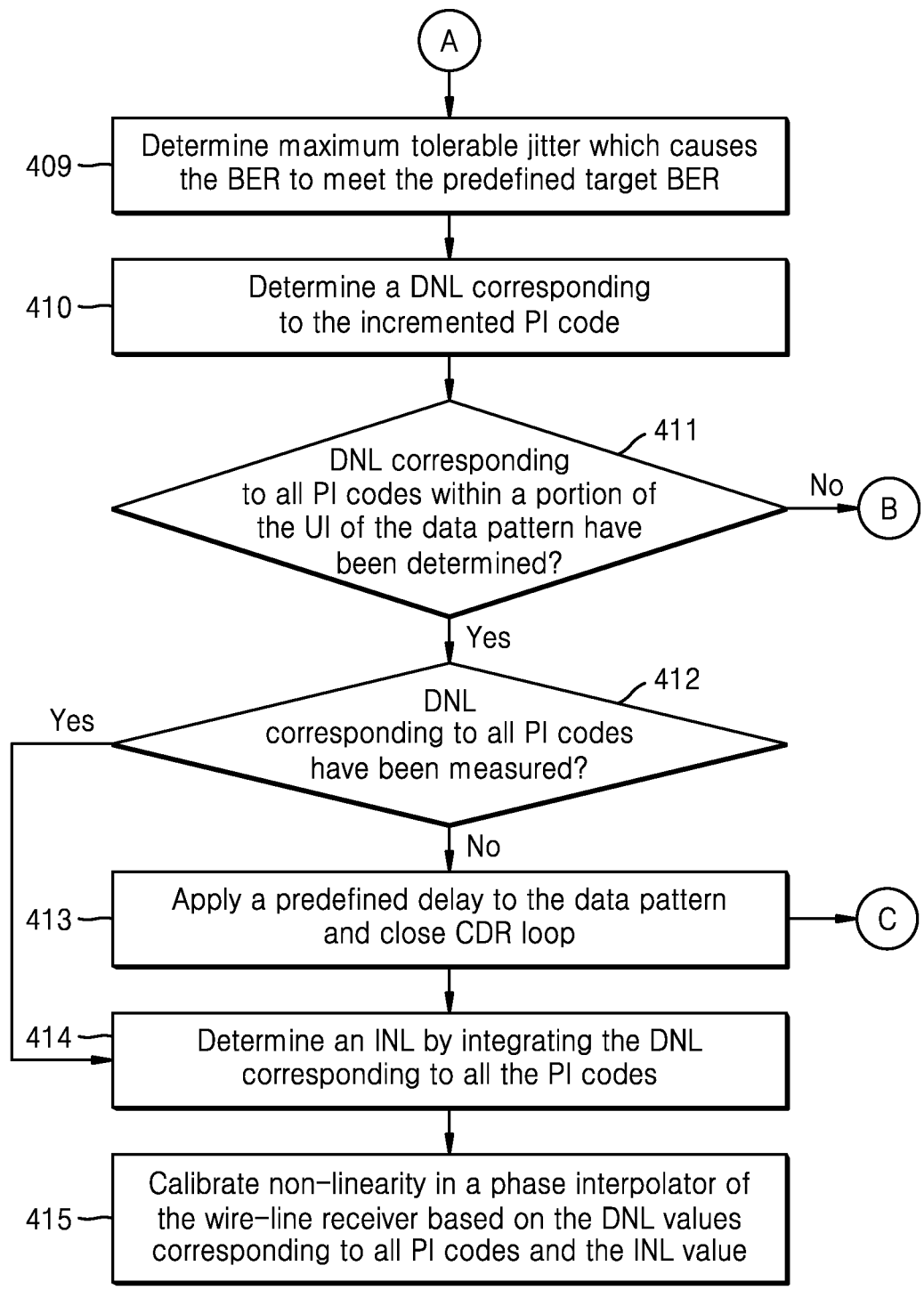

FIGS. 4A and 4B depict a flowchart 400 depicting a method for measuring and calibrating the non-linearity in the phase interpolator 202 of the wire-line receiver 201, according to embodiments as disclosed herein. At step 401, the method includes configuring the pattern generator 203 for generating a clock pattern as the data sequence. There may be no 151 and no frequency offset in the data sequence. Initially, there is no delay applied to the data sequence output by the pattern generator 203. At step 402, the method includes recovering, by the CDR in the wire-line receiver 201, the data pattern, generated by the pattern generator 203, using a recovered clock. The recovered clock can be obtained using the data pattern. At step 403, the method includes determining a predefined target BER. The data sequence generated by the pattern generator 203 is also stored in the wire-line receiver 201 (the same data sequence is generated by the pattern generator 203 as that stored in the wire-line receiver 201).

At step 404, the method includes reading a PI code at which the recovered clock is locked to the data pattern generated by the pattern generator 203. In this example, consider that this PI code is 'x'. The CDR 208 can align the edges of the recovered clock to the centers of the pulses of the data pattern at this PI code x (e.g., by providing this PI code x to the phase interpolator 202 to cause the phase interpolator 202 to align edges of the recovered clock to centers of the pulses of the data sequence). Once the CDR 208 has aligned the recovered clock and the data pattern at PI code 'x', the embodiments include opening the CDR loop. The opening of the CDR loop may not affect the alignment of the data pattern and the recovered clock.

At step 405, the method includes opening the CDR loop while applying the PI code (as read in step 404). Jitter is applied on the data pattern generated by the pattern generator. The embodiments include increasing the value of the jitter applied to the data pattern until the BER increases to the predefined target BER. The application of the jitter introduces errors on the recovered data sequence with respect to the input data sequence. As such, the BER increases. At step 406, the method includes determining a maximum tolerable jitter which causes the BER to increase from zero to the predefined target BER (and may be referred to as the jitter of or associated with the PI code being applied at this time). The jitter causes the recovered clock to sample outside the UI of the pulse of the data pattern. This jitter may be referred to as a first jitter.

At step 407, the method includes incrementing or decrementing the PI code (the action of incrementing or decrementing may be referenced as "incrementing by ±1" or similar phrasing). In an embodiment, the PI code is incremented by ±1. In an example, consider that this PI code is 'x±1'. The variation of the PI code from 'x' (PI code at which the recovered clock was aligned with the data sequence generated by the pattern generator 203) to 'x±1' results in a phase shift in the recovered clock.

At step 408, the method includes applying jitter on the data pattern. The application of jitter changes the jitter tolerance of the wire-line receiver 201. At step 409, the method includes determining a maximum tolerable jitter which causes the BER to meet the predefined target BER. This jitter may be referred to as a second jitter corresponding to the PI code 'x±1'. The absolute value of the amplitude of the second jitter is typically different from the absolute value of the amplitude of the first jitter, as the phase shift introduced to the recovered clock by varying the PI code by ±1 has changed (typically reduced), the jitter tolerance of the wire-line receiver 201.

At step 410, the method includes determining a DNL corresponding to the incremented PI code. Considering this example, the DNL corresponding to PI code 'x±1' is determined. The DNL is determined based on the first jitter (determined at step 406), the second jitter (determined at step 409), and the phase shift introduced to the recovered clock by varying the PI code by ±1. Specifically, based on the previously described equation Abs(Si−Si−1)=PI step+DNLi, DNL and INL may be determined as follow:

$$DNLi = Abs(Si-Si-1) - PI\ step\quad INL = \int DNL$$

The integration is with respect to the PI code. The limits of integration depends on PI code range. For Phase Interpolator with PI step of UI/64, integration limits are from 0 to 63.

At step 411, the method includes determining whether DNL corresponding to all PI codes within a portion of the UI of the data pattern have been determined. In an embodiment, the UI of the data pattern can be segmented to a predefined number of portions. In this example, consider that the UI of the data sequence is segmented into 8 portions. The embodiments include determining whether DNL corresponding to all PI codes within a window size (duration) of UI/8 (e.g., a window centered on the clock edge associated with PI code x) have been determined. The integration is with respect to PI code. The limits of integration depend on PI code range. For the phase interpolator with PI step of UI/64, integration limits are from 0 to 63.

If it is determined, at step 411, that the DNL corresponding to all PI codes within the portion have not been determined, the method proceeds to step 407. Considering the example, the PI code is incremented from 'x±1' to 'x±2'. The second jitter corresponding to the PI code 'x±1' is considered as the first jitter corresponding to the PI code 'x±2'. Thereafter, steps 408 and 409 are performed; wherein, at step 408, jitter is applied to the data sequence at the PI code 'x±2', and at step 409, a second jitter corresponding to the PI code 'x±2' is determined. The second jitter causes the BER to increase from zero to the predefined target BER at the PI code 'x±2'. The absolute value of the second jitter corresponding to the PI code 'x±1' or the first jitter corresponding to the PI code 'x±2' is different from the absolute value of the second jitter corresponding to the PI code 'x±2'.

Thereafter, the method includes determining the DNL corresponding to the PI code 'x±2' (step 410). The loop (steps 411-407-411) continues until the DNL corresponding to all PI codes within the portion of the UI (e.g., a window of UI/8) are determined. If it is determined, at step 411, that the DNL corresponding to all PI codes within the portion of the UI have been determined, the method includes, at step 412, determining whether DNL corresponding to all PI codes (e.g., of the wireline receiver, corresponding to the entire UI) have been determined.

If it is determined, at step 412, that DNL corresponding to all PI codes have not been determined, the method includes, at step 413, applying a predefined delay to the data pattern generated by the pattern generator 203. Considering this example, the predefined delay is UI/8. The delay introduces a phase shift of ±UI/8 to the data pattern. Thereafter, after closing the CDR loop, the method proceeds to step 402 and performs steps 402 and 404 (step 403 may be skipped if the target bit error rate has been retained during the method), to determine the new PI code at which the data sequence aligns with the recovered clock. This is followed by determining the DNL corresponding to all PI codes corresponding to the next portion of the UI.

If it is determined, at step 412, that DNL corresponding to all PI codes have been determined, the method includes, at step 414, determining an INL in the phase interpolator 202 of the wire-line receiver 201, by integrating the DNL corresponding to all the PI codes as described herein. At step 415, the method includes calibrating the non-linearity in the phase interpolator 202 of the wire-line receiver 201 based on the DNL values corresponding to all PI codes and the INL value.

The various actions in the flowchart 400 may be performed in the order presented, in a different order, or simultaneously. Further, in some embodiments, some actions of the method of FIGS. 4A and 4B may be omitted.

FIG. 5 depicts a comparison between jitter tolerance curves of the wire-line receiver before and after calibrating PI non-linearity, according to embodiments as disclosed herein. FIG. 5 shows the specification of jitter tolerance curve (denoting a required minimum jitter tolerance, such as according to a device specification) of the wire-line receiver 201 (bottom curve), jitter tolerance curve without calibration of the non-linearity in the phase interpolator 202 (middle curve), and jitter tolerance curve with the calibration of the non-linearity in the phase interpolator 202 (top curve).

As depicted in FIG. 5, the X-axis represents the frequency of the jitter, and the Y-axis represents the applied jitter (in terms of peak-to-peak UI). As per the specification, the wire-line receiver 201 can completely track the applied jitter (even if the peak-to-peak applied jitter is equal to the UI), provided that the frequency of the applied jitter is within the bandwidth of the CDR. If frequency of applied jitter increases beyond the bandwidth of the CDR, the capability of the wire-line receiver 201 to track the applied jitter progressively decreases. In an example, consider that the bandwidth of the CDR is 10 MHz, the jitter tolerance of the wire-line receiver 201 drops closer to 0.1 UI at 10 MHz. If the frequency of the applied jitter increases further, the wire-line receiver 201 will not be able to track the applied jitter.

The jitter tolerance of a tested wire-line receiver 201 (without calibration) is represented by the 'W/O PI calibration' curve. The wire-line receiver 201 is able to track higher applied peak-to-peak jitter amplitude compared to that of the specification curve. The calibration of the phase interpolator 202 based on the determined non-linearity allows further improvement of the jitter tolerance (as represented by 'With PI calibration curve) of the wire-line receiver 201. The wire-line receiver 201 is able to track higher applied peak-to-peak jitter compared to that of the 'W/O phase interpolator calibration' curve, at the same jitter frequency. Based on the measurements (as depicted in the curves), the jitter tolerance improvement is 0.05*UI–0.1*UI.

The embodiments disclosed herein describe methods and systems for measuring non-linearity in a phase interpolator of a wire-line receiver and utilizing the measured non-linearity for calibrating the phase interpolator. Such measurements and calibration of the wire-line receiver 201 may be performed by controller 220 of FIG. 2. For example, controller 220 may be connected to and communicate (a) with the CDR 208 to control the opening and closing of the CDR loop, (b) with the phase detector 207 to determine the PI code to which the recovered clock is locked to the data sequence (i.e., read by controller 220 in step 404) and to cause incrementing of the PI codes (i.e., step 407), (c) with the error detector 210 to determine or obtain BER based on a comparison of the recovered data sequence and the stored data sequence, and (d) with the pattern generator 203 to control the operation of the pattern generator (e.g., to determine the data pattern and/or timing of pattern generator 203 as well as to controlling the adding of jitter to the data pattern by the pattern generator 203). In some examples, the controller 220 and pattern generator 203 may be integrally formed (e.g., both being part of an IC tester). In other examples, the controller 220 may be "on-chip" and be part of the integrated circuit forming the wire-line receiver 201. The controller 220 may be configured by software.

Therefore, it is understood that the scope of the protection is extended to such software and to a computer readable storage containing program code for implementation of one or more steps of the method described herein. The method may be implemented in a preferred embodiment through or together with a software program written Very high speed integrated circuit Hardware Description Language (VHDL), or any other programming language, and/or implemented by one or more software modules configuring controller 220 or other hardware device. The controller 220 may be dedicated hardware, such as an Application-Specific Integrated Circuit (ASIC), or a combination of hardware and software means, for example, an ASIC and a Field Programmable Gate Array (FPGA), or at least one microprocessor and at least one memory with software modules located therein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the embodiments as described herein.

We claim:

1. A method for determining non-linearity in a Phase Interpolator (PI) of a wire-line receiver, the method comprising:

determining a first jitter value causing a Bit Error Rate (BER) of a data sequence to exceed a predefined target BER when a recovered clock is aligned with the data sequence at a first PI code;

determining a second jitter value causing the BER of the data sequence to exceed the predefined target BER at a second PI code, wherein the first PI code is adjacent to the second PI code;

determining a Differential Non-Linearity (DNL) corresponding to the second PI code based on a phase shift introduced to the recovered clock by the second PI code relative to the first PI code, the first jitter value, and the second jitter value; and calibrating the PI based on the determined DNL.

2. The method, as claimed in claim 1, wherein the data sequence is a clock pattern generated by a pattern generator, wherein a recovered data sequence is obtained by the wire-line receiver using the recovered clock.

3. The method, as claimed in claim 1, wherein the method further comprises measuring the DNL corresponding to a third PI code, based on the second jitter value, a jitter value causing the BER of the data sequence to exceed the predefined target BER, and a phase shift introduced to the recovered clock by the third PI code relative to the second PI code, wherein the second PI code is adjacent to the third PI code.

4. The method, as claimed in claim 1, further comprising:
generating a data pattern with a pattern generator, the data pattern representing the data sequence,
wherein a Unit Interval (UI) of the data pattern is segmented into a predefined number of parts, wherein each of the predefined number of parts corresponds to a corresponding subset of PI codes, wherein the DNL corresponding to each of the PI codes in at least some of the subsets is determined after introducing a delay to the data pattern generated by the pattern generator.

5. The method, as claimed in claim 4, wherein the phase delay corresponds to UI/k, where k is an integer.

6. The method, as claimed in claim 4, wherein the method further comprises measuring an Integral Non-Linearity (INL) of the PI by integrating the DNL corresponding to each of the plurality of PI codes available to control the PI in the wire-line receiver.

7. The method, as claimed in claim 6, wherein the method further comprises calibrating the PI with the INL and the DNL corresponding to each of the plurality of PI codes.

8. A wire-line receiver comprising:
a phase locked loop (PLL) configured to generate an internal clock;
a phase interpolator (PI) configured to generate a recovered clock as the internal clock received by the PLL with a delay, the delay being determined by a selected PI code provided to the phase interpolator;
a sampler configured to sample data patterns received by the wire-line receiver at a timing determined by the recovered clock;
a phase detector configured to provide the selected PI code to the phase interpolator, the selected PI code being a selected one of a plurality of PI codes; and
a controller configured to:
determine a first jitter value that causes a Bit Error Rate (BER) of a data pattern to exceed a predefined target BER when the recovered clock is aligned with the data pattern at a first PI code of the plurality of PI codes,
determine a second jitter value that causes the BER of the data pattern to exceed the predefined target BER at a second PI code of the plurality of bit codes, wherein the first PI code is adjacent to the second PI code, and
determine a Differential Non-Linearity (DNL) corresponding to the second PI code based on a phase shift introduced to the recovered clock by the second PI code relative to the first PI code, the first jitter value, and the second jitter value.

9. The wire-line receiver, as claimed in claim 8, wherein the data pattern is a clock pattern generated by a pattern generator in the wire-line receiver, wherein the sampler is configured to obtain a recovered data sequence by sampling the data pattern using the recovered clock.

10. The wire-line receiver, as claimed in claim 8, wherein the controller is further configured to determine the DNL corresponding to a third PI code, based on the second jitter value, a jitter value causing the BER of the data sequence to exceed the predefined target BER, and a phase shift introduced to the recovered clock by the third PI code relative to the second PI code, wherein the second PI code is adjacent to the third PI code.

11. The wire-line receiver, as claimed in claim 8, wherein the wire-line receiver is configured to determine the DNL corresponding to subsets of the plurality of PI codes, wherein each subset of the plurality of PI codes is determined by providing the data pattern by the pattern generator with a different corresponding delay.

12. The wire-line receiver, as claimed in claim 11, wherein the corresponding delay associated with each subset of the plurality of PI codes equals an integer multiple of UI/k, where k is an integer equal to 2 or more, and UI is a Unit Interval of the data pattern.

13. The wire-line receiver, as claimed in claim 11, wherein the controller is configured to determine an Integral Non-Linearity (INL) of the PI by integrating the DNL corresponding to each of the plurality of PI codes.

14. The wire-line receiver, as claimed in claim 13, wherein the controller is configured to calibrate the PI with the INL and the DNL corresponding to each of the plurality of PI codes.

15. The method, as claimed in claim 1, wherein the steps of determining the first jitter value, determining the second jitter value and determining the DNL corresponding to the second PI code, and calibrating the PI are performed by the wire-line receiver.

16. The method of claim 15, wherein the wire-line receiver is a semiconductor chip.

* * * * *